(12) United States Patent
Yoo et al.

(10) Patent No.: US 11,693,307 B2
(45) Date of Patent: Jul. 4, 2023

(54) RETICLE POD FOR PREVENTING HAZE CONTAMINATION AND RETICLE STOCKER HAVING THE SAME

(71) Applicant: XIA TAI XIN SEMICONDUCTOR (QING DAO) LTD., Qingdao (CN)

(72) Inventors: Jiyong Yoo, Singapore (SG); Byung-In Kwon, Singapore (SG); Dae-Youp Lee, Singapore (SG)

(73) Assignee: XIA TAI XIN SEMICONDUCTOR (QING DAO) LTD., Qingdao (CN)

( * ) Notice: Subject to any disclaimer, the term of this patent is extended or adjusted under 35 U.S.C. 154(b) by 700 days.

(21) Appl. No.: 16/694,958

(22) Filed: Nov. 25, 2019

(65) Prior Publication Data
US 2021/0157227 A1    May 27, 2021

(51) Int. Cl.
| | |
|---|---|
| *G03F 1/66* | (2012.01) |
| *H01L 21/673* | (2006.01) |
| *G03F 7/00* | (2006.01) |
| *H05F 1/00* | (2006.01) |
| *G03F 1/38* | (2012.01) |

(52) U.S. Cl.
CPC .................. *G03F 1/66* (2013.01); *G03F 1/38* (2013.01); *G03F 7/70741* (2013.01); *H01L 21/67359* (2013.01); *H01L 21/67393* (2013.01); *H05F 1/00* (2013.01)

(58) Field of Classification Search
CPC .......... G03F 1/66; G03F 1/38; G03F 7/70741; G03F 7/70916; H01L 21/67359; H01L 21/67393; H05F 1/00
USPC ......................................................... 361/212
See application file for complete search history.

(56) References Cited

U.S. PATENT DOCUMENTS

| | | | |
|---|---|---|---|
| 6,642,531 B1 * | 11/2003 | Powers | G03F 1/24 430/5 |
| 2002/0179852 A1 | 12/2002 | Zheng et al. | |
| 2003/0186131 A1 * | 10/2003 | Enloe | B82Y 40/00 355/75 |
| 2005/0030694 A1 * | 2/2005 | Morioka | H05F 3/04 361/212 |
| 2007/0126322 A1 * | 6/2007 | Chiou | H01L 21/67724 312/249.8 |

FOREIGN PATENT DOCUMENTS

| | | |
|---|---|---|
| CN | 1708828 A | 12/2005 |
| CN | 202279374 U | 6/2012 |
| CN | 105045035 A | 11/2015 |

(Continued)

*Primary Examiner* — Thienvu V Tran
*Assistant Examiner* — Sreeya Sreevatsa
(74) *Attorney, Agent, or Firm* — ScienBiziP, P.C.

(57) ABSTRACT

A stocker for holding a plurality of reticle pods is provided. Each of the reticle pods is configured to accommodate a reticle assembly. The reticle assembly includes a reticle and a pellicle covering the reticle. The stocker includes a main frame and an electrostatic generator. The main frame has an inner space and at least one pod support disposed in the inner space. The pod support divides the inner space into a plurality of chambers configured to respectively accommodate the plurality of reticle pods. The electrostatic generator is coupled to the reticle assembly and configured to generate static electricity to the reticle assembly. The static electricity alternates between positive electricity and negative electricity.

17 Claims, 8 Drawing Sheets

(56) References Cited

FOREIGN PATENT DOCUMENTS

| KR | 20090122647 | A | * | 1/2009 |
|---|---|---|---|---|
| TW | 200712785 | A | | 4/2007 |
| TW | 201504767 | A | | 2/2015 |

* cited by examiner

S500

Providing a stocker for accommodating a plurality of reticle pods, wherein each of the reticle pods is configured to accommodate one of the reticle assemblies, the stocker comprises a main frame having an inner space, at least one pod support disposed in the inner space, and an electrostatic generator coupled to each of the reticle assemblies ⸺S501

Producing static electricity to the reticle assembly by the electrostatic generator ⸺S502

Alternating the static electricity between positive electricity and negative electricity ⸺S503

Providing a reticle pod for accommodating the reticle assembly, wherein the reticle pod comprises a box frame, a plurality of reticle supports disposed in the box frame, and an electrostatic generator coupled to the reticle assembly ⟵S601

Producing static electricity to the reticle assembly by the electrostatic generator ⟵S602

Alternating the static electricity between positive electricity and negative electricity ⟵S603

FIG. 6

RETICLE POD FOR PREVENTING HAZE CONTAMINATION AND RETICLE STOCKER HAVING THE SAME

FIELD

The present disclosure generally relates to a reticle pod for preventing haze contamination and a reticle stocker having the same. More specifically, the present disclosure relates to a reticle pod and a reticle stocker having an electrostatic generator that can prevent haze particles from contaminating the reticle.

BACKGROUND

Integrated circuits are generally made by photolithographic processes that use reticles (or photomasks) and an associated light source to project a circuit image on the surface of a silicon wafer. Reticles are generally made from flat pieces of quartz or soda-lime glass coated with a metallic layer (e.g., a chromium layer) forming a pattern for an electronic circuit. A pellicle is typically used to seal the reticle, so as to isolate and protect the patterns of the reticle surface from particulate contamination and eliminate dust or other particles from the focal plane of the pattern. The reticle and the pellicle may be collectively called a reticle assembly. Contaminating particles may be caught between the reticle and the pellicle when the two are affixed together. The contaminating particles on the surface of the reticle and pellicle may cause the photolithographic pattern transmitted on the wafer to change, distort, alter, etc. from its intended design, ultimately impacting the quality of the semiconductor device manufactured. Referring to FIG. 1, a schematic diagram showing contaminating particles on a reticle assembly are illustrated. As shown in FIG. 1, a reticle assembly 100 includes a reticle 110 and a pellicle 120 covering the reticle 110. The reticle 110 has a quartz layer 111 and a chromium layer 112 coated on one side of the quartz layer 111. The pellicle 120 covers the chromium layer 112 of the reticle. The chromium layer 112 having gaps and lines forms a pattern for transferring an image to a wafer. Particle P1 is located on the other side of the quartz layer 111. Particle P2 is located in a gap of the chromium layer 112. Particle P3 is located on a surface of the chromium layer 112. Particle P4 is in a space between the chromium layer 112 and the pellicle 120. Particle P5 is located on a bottom surface of the pellicle 120. The particle P1 has minor impact on the quality of the semiconductor device, and can be removed by $N_2$ blowing. The particle P2 has critical impact on the semiconductor quality, and must be removed by reticle cleaning processes with cleaning agents. The particle P3 usually has no impact on the semiconductor quality, and can be removed during the reticle cleaning processes. The particle P4 has minor impact on the semiconductor quality, and also can be removed during the reticle cleaning processes. The particle P5 usually has no impact on the quality, and can be removed by $N_2$ blowing.

One type of contaminating particle is referred to as haze particles. Haze particles are precipitants formed from chemical residuals or impurities of the reticle cleaning processes. For example, as illustrated in FIG. 2, when a solution including ammonium ($NH_4^+$) and sulfate ($SO_4^{2-}$) is used to clean the reticle assembly 100, the ammonium ($NH_4^+$) and sulfate ($SO_4^{2-}$) residuals may form ammonium sulfate $(NH_4)_2SO_4$ precipitants when exposed to short wavelength UV light, such as 248 nm or 193 nm light. Other precipitants such as organic compounds may also form during the photolithographic processes. The chemical residuals and impurities may be removed by $N_2$ purging. $N_2$ purging involves a process of introducing $N_2$ gas into a reticle stocker (or photomask stocker) and diffusing chemical residuals and impurities out of the reticle stocker. However, $N_2$ purging is unable to remove the chemical residuals or impurities (such as ammonium and sulfate) that are trapped in the space between the reticle 110 and the pellicle 120.

Accordingly, there remains a need to provide an apparatus that can prevent haze particles from contaminating the reticle.

SUMMARY

In view of above, the present disclosure is directed to a reticle pod and a reticle stocker having an electrostatic generator that can prevent haze particles from contaminating the reticle.

An implementation of the present disclosure is directed to a stocker for holding a plurality of reticle pods. Each of the reticle pods is configured to accommodate a reticle assembly. The reticle assembly includes a reticle and a pellicle covering the reticle. The stocker includes a main frame and an electrostatic generator. The main frame has an inner space and at least one pod support disposed in the inner space. The pod support divides the inner space into a plurality of chambers configured to respectively accommodate the plurality of reticle pods. The electrostatic generator is coupled to the reticle assembly and configured to generate static electricity to the reticle assembly. The static electricity alternates between positive electricity and negative electricity.

Another implementation of the present disclosure is directed to a reticle pod for accommodating a reticle assembly. The reticle assembly includes a reticle and a pellicle covering the reticle. The reticle pod includes a box frame, a plurality of reticle supports, and an electrostatic generator. The box frame is configured to accommodate the reticle assembly. The plurality of reticle supports is disposed in the box frame and configured to support the reticle assembly. The electrostatic generator is coupled to the reticle assembly and configured to generate static electricity to the reticle assembly. The static electricity alternates between positive electricity and negative electricity.

Another implementation of the present disclosure is directed to a method of storing a plurality of reticle assemblies. Each of the reticle assemblies comprises a reticle and a pellicle covering the reticle. The method includes actions S501 to S503 as shown in FIG. 5. In action S501, a stocker for accommodating a plurality of reticle pods is provided. Each of the reticle pods is configured to accommodate one of the reticle assemblies. The stocker includes a main frame having an inner space, at least one pod support disposed in the inner space, and an electrostatic generator coupled to each of the reticle assemblies. The pod support divides the inner space into a plurality of chambers configured to respectively accommodate the plurality of reticle pods. In action S502, the electrostatic generator generates static electricity to each of the reticle assemblies. In action S503, the static electricity alternates between positive electricity and negative electricity.

Yet another implementation of the present disclosure is directed to a method of storing a reticle assembly. The reticle assembly includes a reticle and a pellicle covering the reticle. The method includes actions S601 to S603 as shown in FIG. 6. In action S601, a reticle pod for accommodating the reticle assembly is provided. The reticle pod includes a box frame, a plurality of reticle supports disposed in the box frame, and an electrostatic generator coupled to the reticle assembly. In action S602, the electrostatic generator generates static electricity to the reticle assembly. In action S603, the static electricity alternates between positive electricity and negative electricity.

As described above, the reticle pod and the stocker of the implementations of the present disclosure include an electrostatic generator for generating static electricity to the reticle and the pellicle of the reticle assembly. The static electricity alternates between positive electricity and negative electricity at a constant frequency to move charged particles trapped in the reticle assembly away from the surface of the reticle and the pellicle. Therefore, the reticle pod and the stocker of the implementations of the present disclosure can prevent haze particles formation on the surface of the reticle, and greatly reduce wafer defects caused by haze contamination.

BRIEF DESCRIPTION OF THE DRAWINGS

Implementations of the present technology will now be described, by way of example only, with reference to the attached figures.

FIG. 5 is a flowchart of a method of storing a plurality of reticle assemblies according to another implementation of the present disclosure.

FIG. 6 is a flowchart of a method of storing a reticle assembly according to yet another implementation of the present disclosure.

DETAILED DESCRIPTION

Figure 1:
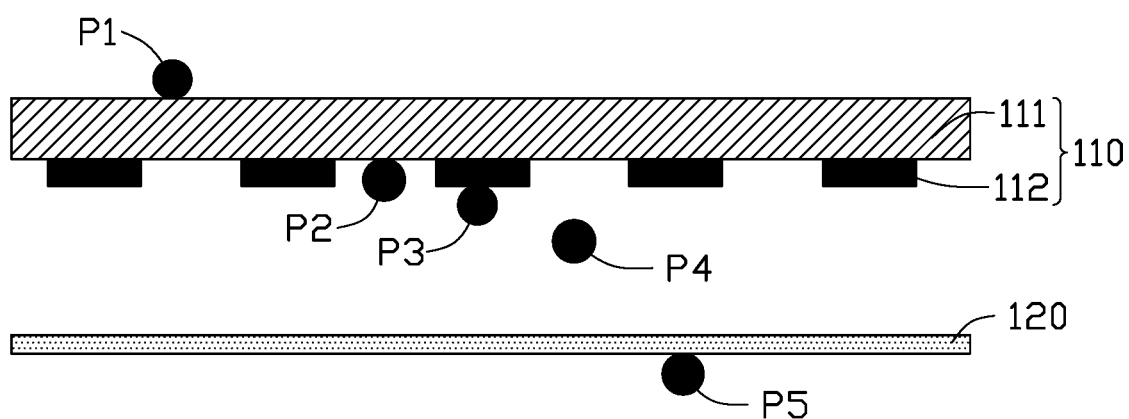
FIG. 1 is a schematic diagram showing contaminating particles on a reticle assembly.
Figure 2:
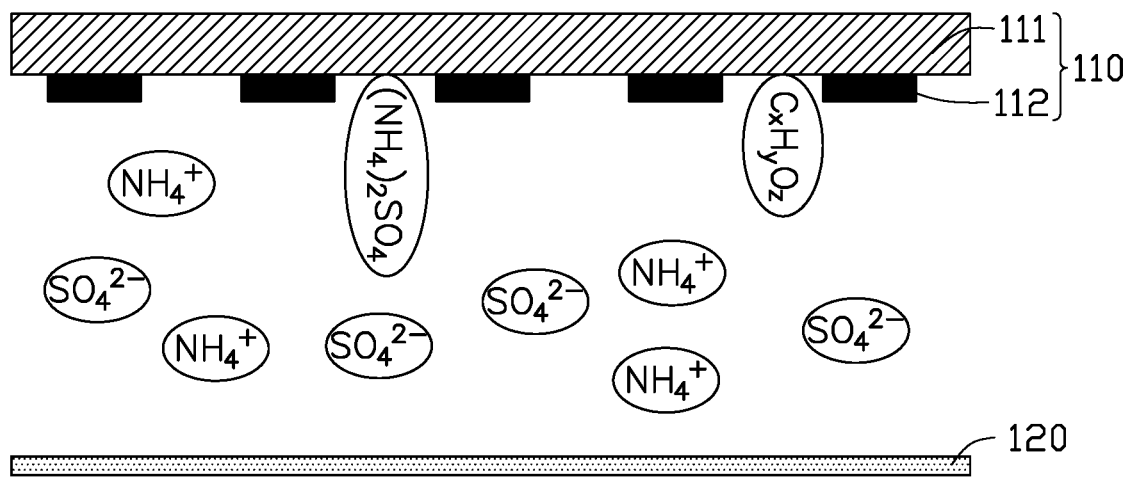
FIG. 2 is a schematic diagram showing haze particles in the reticle assembly of FIG. 1.

The present disclosure will now be described more fully hereinafter with reference to the accompanying drawings, in which example implementations of the disclosure are shown. This disclosure may, however, be implemented in many different forms and should not be construed as limited to the example implementations set forth herein. Rather, these example implementations are provided so that this disclosure will be thorough and complete, and will fully convey the scope of the disclosure to those skilled in the art. Like reference numerals refer to like elements throughout.

The terminology used herein is for the purpose of describing particular example implementations only and is not intended to be limiting of the disclosure. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, actions, operations, elements, and/or components, but do not preclude the presence or addition of one or more other features, regions, integers, actions, operations, elements, components, and/or groups thereof.

It will be understood that the term "and/or" includes any and all combinations of one or more of the associated listed items. It will also be understood that, although the terms first, second, third etc. may be used herein to describe various elements, components, regions, parts and/or sections, these elements, components, regions, parts and/or sections should not be limited by these terms. These terms are only used to distinguish one element, component, region, part or section from another element, component, region, layer or section. Thus, a first element, component, region, part or section discussed below could be termed a second element, component, region, layer or section without departing from the teachings of the present disclosure.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The description will be made as to the example implementations of the present disclosure in conjunction with the accompanying drawings in FIGS. 3A to 6. Reference will be made to the drawing figures to describe the present disclosure in detail, wherein depicted elements are not necessarily shown to scale and wherein like or similar elements are designated by same or similar reference numeral through the several views and same or similar terminology.

The present disclosure will be further described hereafter in combination with the accompanying figures.

Figure 3A:
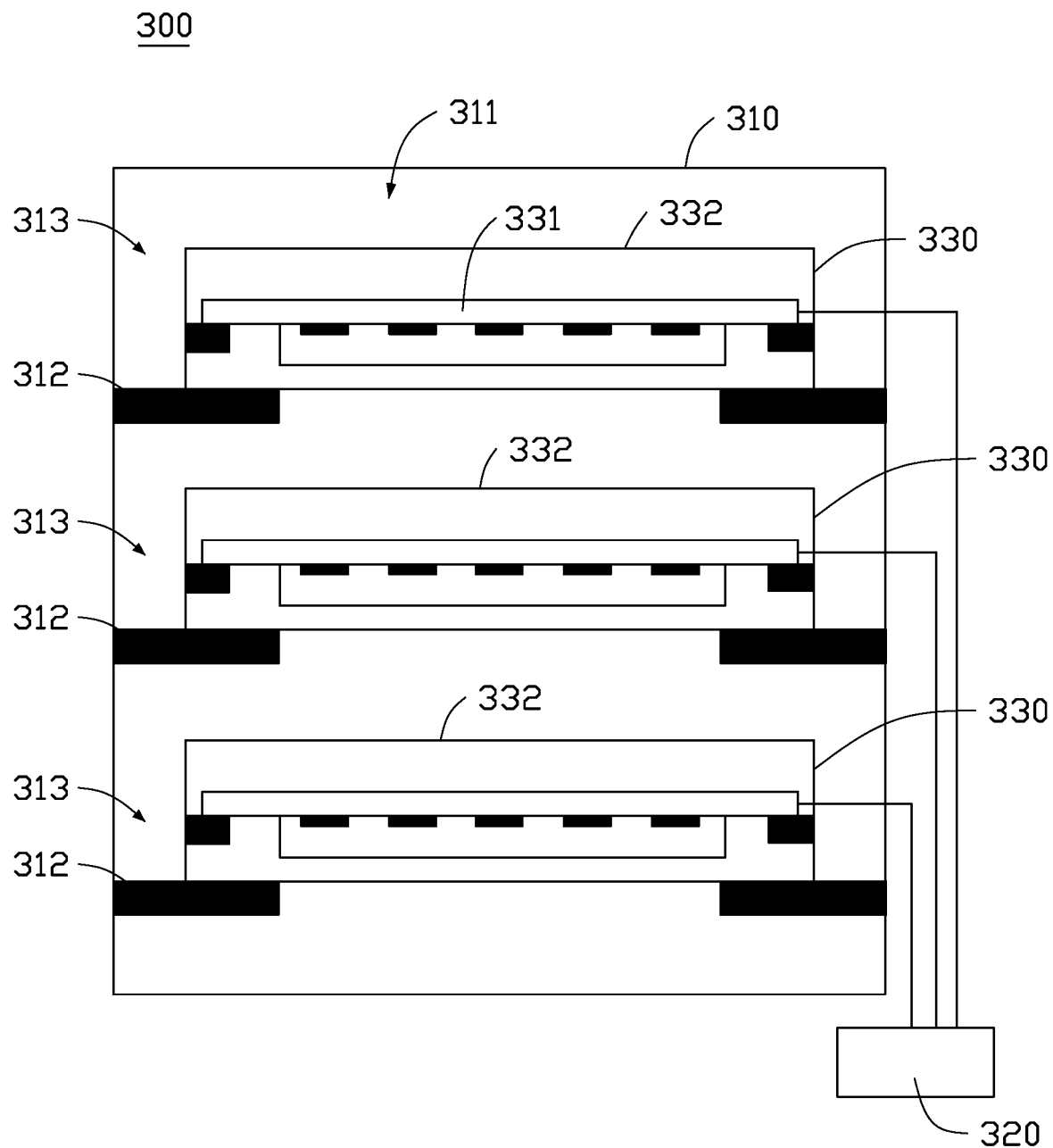
FIG. 3A is a schematic diagram of a stocker for holding a plurality of reticle pods according to an implementation of the present disclosure.
Figure 3B:
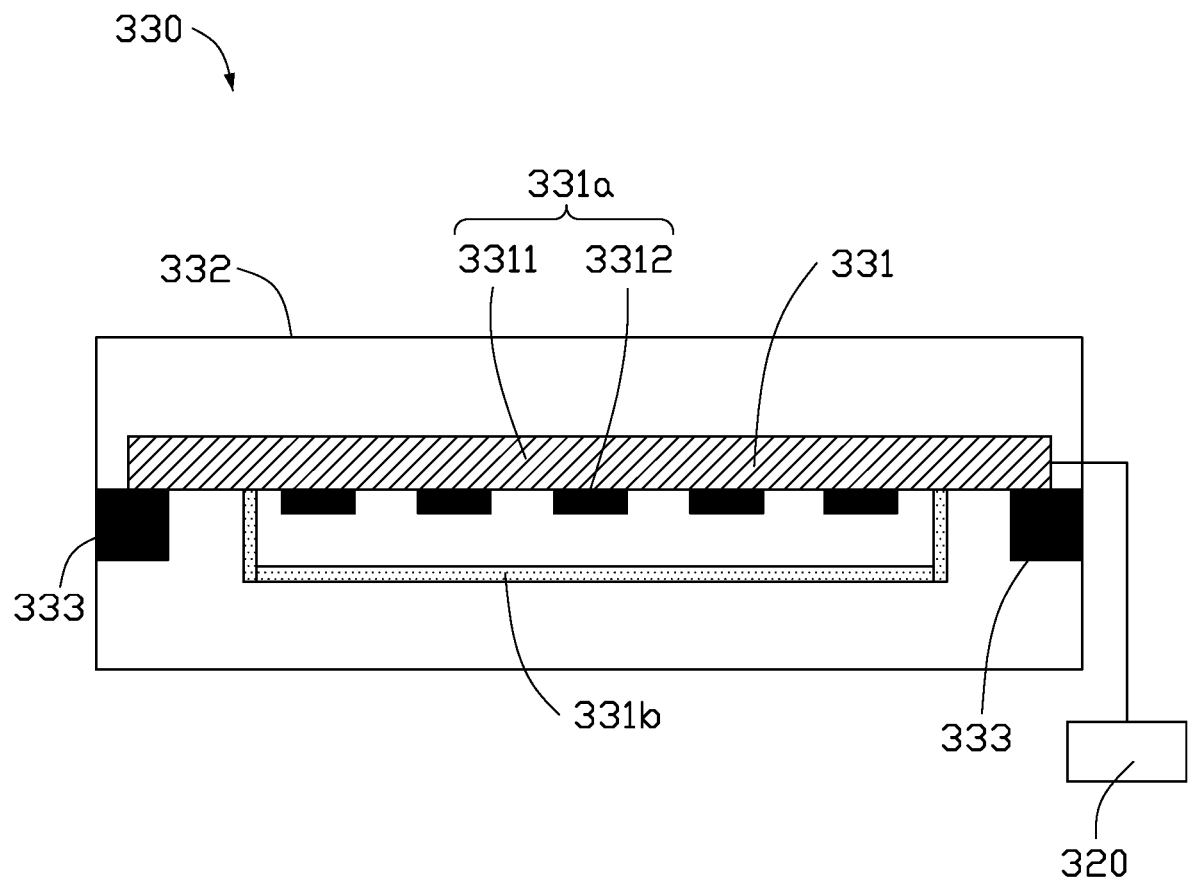
FIG. 3B is a schematic diagram of one of the reticle pods of FIG. 3A.

Referring to FIG. 3A, a schematic diagram of a stocker for holding a plurality of reticle pods according to an implementation of the present disclosure is illustrated. Referring to FIG. 3B, a schematic diagram of one of the reticle pods of FIG. 3A is illustrated. As shown in FIGS. 3A and 3B, the stocker 300 for holding a plurality of reticle pods 330 includes a main frame 310 and an electrostatic generator 320. Each of the reticle pods 330 is configured to accommodate a reticle assembly 331. The reticle assembly 331 includes a reticle 331a and a pellicle 331b covering the reticle 331a. The main frame 310 of the stocker 300 has an inner space 311 and at least one pod support 312 disposed in the inner space 311. The pod support 312 divides the inner space 311 into a plurality of chambers 313 configured to respectively accommodate the plurality of reticle pods 330. In other words, one chamber 313 accommodate one reticle pod 330. In this implementation, the stocker 300 has three chambers 313 to accommodate reticle pods 330. In other implementations, the stocker 300 may have more than three chambers 313 to accommodate more reticle pods 330.

The electrostatic generator 320 may be disposed on the main frame 310 of the stocker 300. The electrostatic generator 320 is coupled to each of the reticle assemblies 331 and generate static electricity to each of the reticle assemblies 331 in the reticle pods 330. The static electricity alternates between positive electricity and negative electricity. Preferably, static electricity alternates between positive electricity and negative electricity at a constant frequency ranging from 6 to 600 counts per minute.

The reticle 331a of the reticle assembly 331 includes a transparent layer 3311 and a metallic layer 3312 disposed on one side of the transparent layer 3311. The pellicle 331b of the reticle assembly 331 covers the metallic layer 3312 of the reticle 331a. The electrostatic generator 320 generates static electricity to the reticle 331a and the pellicle 331b of the reticle assembly 331. The transparent layer 3311 is a quartz layer or a soda-lime glass layer. The metallic layer 3312 is a chromium layer having gaps and lines to form a pattern for transferring onto a wafer.

Each of the reticle pods 330 includes a box frame 332 configured to accommodate the reticle assembly 331, and a plurality of reticle supports 333 disposed in the box frame 332 and configured to support the reticle assembly 331. The plurality of the reticle supports 333 are configured to hold the transparent layer 3311 of the reticle 331a.

Figure 4A:
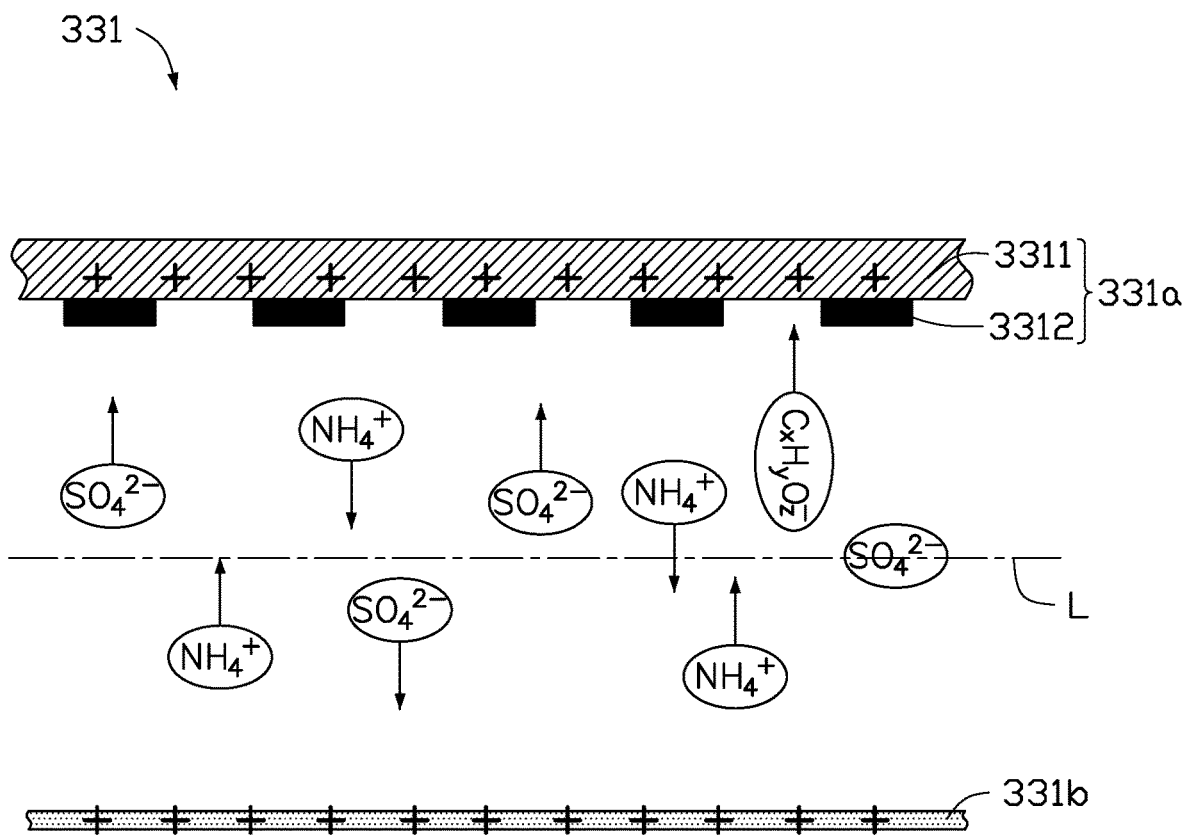
FIGS. 4A and 4B are schematic diagrams showing the effect of static electricity on a reticle assembly.
Figure 4B:
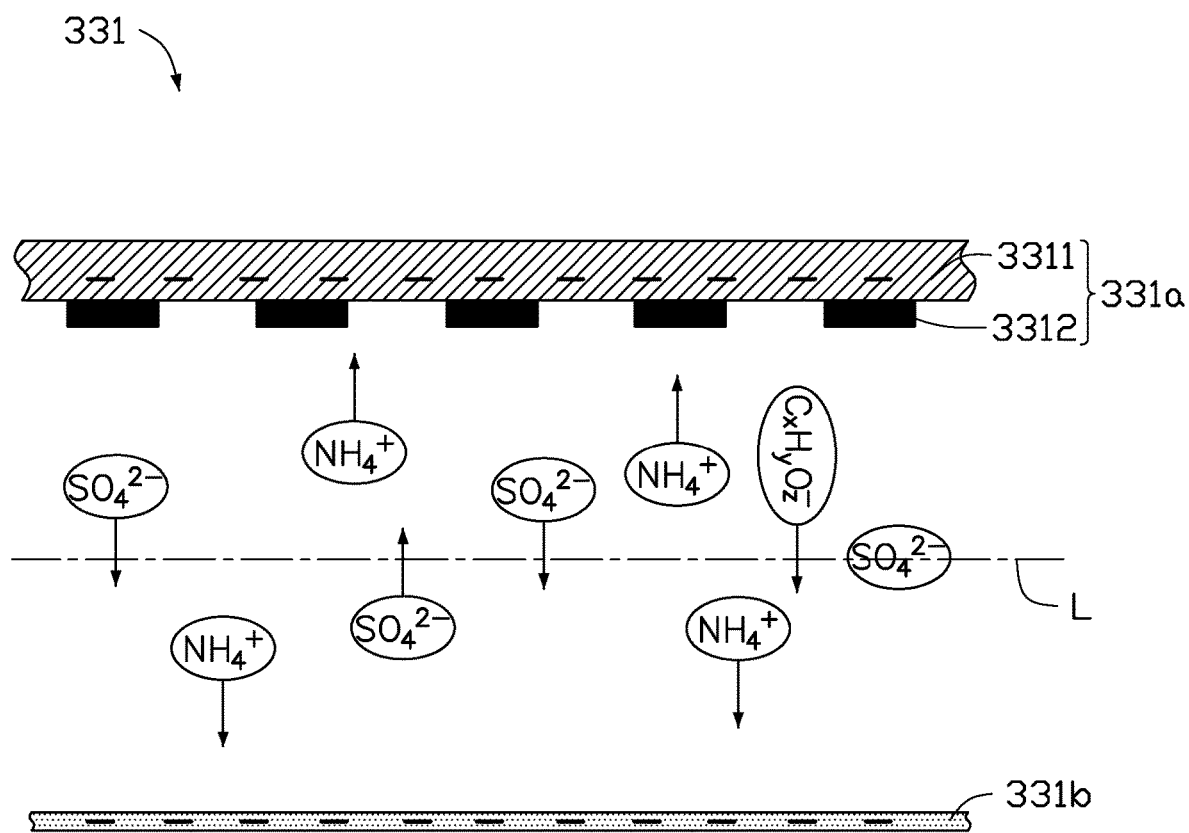
Figure 4C:
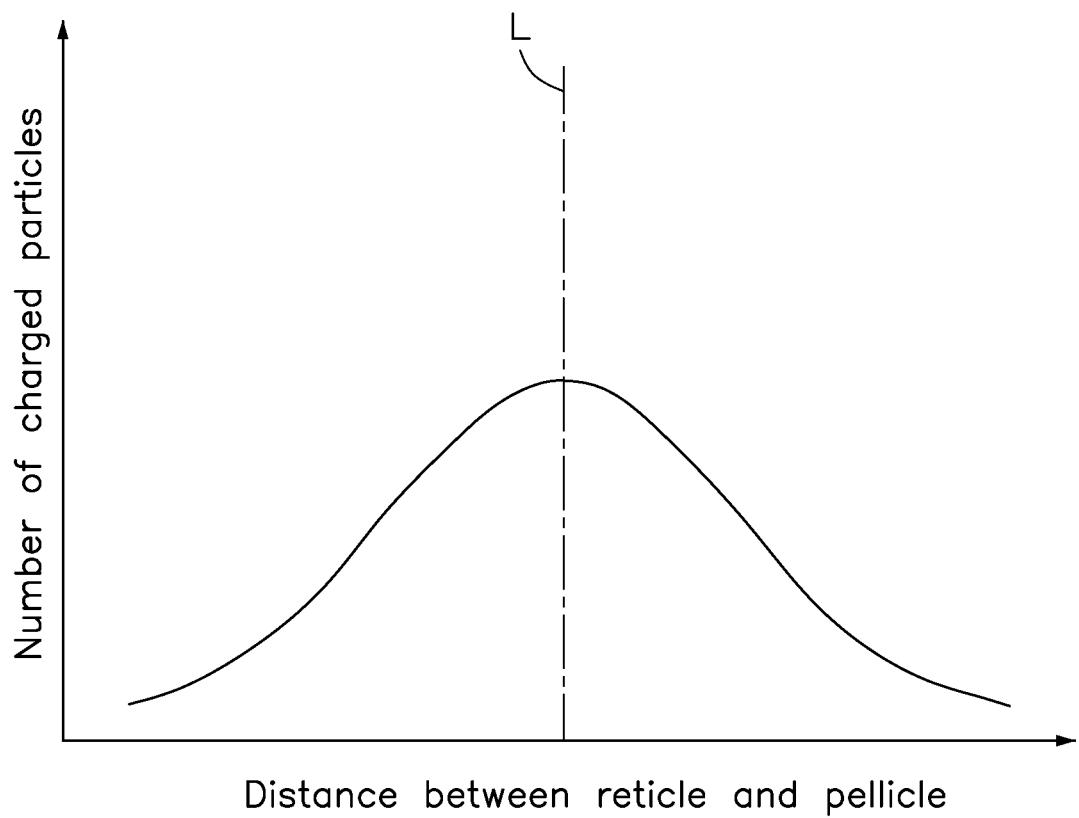
FIG. 4C is a schematic diagram showing a charged particle distribution between a reticle and a pellicle of the reticle assembly of FIGS. 4A and 4B.

Referring to FIGS. 4A and 4B, schematic diagrams showing the effect of static electricity on the reticle assembly 331 of FIGS. 3A and 3B are illustrated. Charged particles such as ammonium ($NH_4^+$), sulfate ($SO_4^{2-}$) and other particles may be trapped in the space between the reticle 331a and the pellicle 331b after reticle cleaning processes. As the reticle assembly 331 is exposed to light, the charged particles may form haze contamination (such as ammonium sulfate ($NH_4$)$_2SO_4$ precipitants) on the metallic layer 3312 of the reticle 331a, and cause critical defect on the wafer. The electrostatic generator 320 is coupled to the reticle assembly 331 and configured to generate the static electricity to the reticle assembly 331. The static electricity alternates between positive electricity and negative electricity to prevent haze particles formation on the metallic layer 3312 of the reticle 331a. As show in FIG. 4A, when the electrostatic generator 320 generates positive static electricity to the reticle assembly 331, the reticle 331a and the pellicle 331b of the reticle assembly 331 carry positive static charges. Due to the repulsion force from the positive static charges carried by the reticle assembly 331, positively charged particles (such as $NH_4^+$) near the surface of the reticle 331a and the surface of the pellicle 331b would move toward a center line L between the reticle 331a and the pellicle 331b. As shown in FIG. 4B, when the electrostatic generator 320 generates negative static electricity to the reticle assembly 331, the reticle 331a and the pellicle 331b carry negative static charges. Due to the repulsion force from the negative static charges carried by the reticle assembly 331, negatively charged particles (such as $SO_4^{2-}$ or $C_xH_yO_z^-$) near the surface of the reticle 331a and the surface of the pellicle 331b would move toward the center line L between the reticle 331a and the pellicle 331b. Therefore, by periodically alternating the static electricity between positive electricity and negative electricity, the charged particles tend to accumulate around the center line L of the space between the reticle 331a and the pellicle 331b. Referring to FIG. 4C, a schematic diagram showing the distribution of charged particles between the reticle 331a and the pellicle 331b of the reticle assembly 331 are illustrated. As shown in FIG. 4C, the number of charged particles around the center line L is much higher than those near the surface of the reticle 331a and the pellicle 331b. The charged particles are kept away from the surface of the reticle 331a and the pellicle 331b to prevent formation of haze particles on the surface of the metallic layer 3312 of the reticle 331a. Therefore, defects on the wafer caused by haze particles during the exposure process can be greatly reduced.

According to another implementation, the present disclosure also is directed to a reticle pod for accommodating a reticle assembly. The reticle pod of this implementation can be referred to the reticle pod 330 of FIG. 3B. As shown in FIG. 3B, the reticle pod 330 for accommodating a reticle assembly 331 includes a box frame 332, a plurality of reticle supports 333 disposed in the box frame 332, and an electrostatic generator 320 coupled to the reticle assembly 331. The box frame 332 is configured to accommodate the reticle assembly 331. The plurality of reticle supports 333 are configured to support the reticle assembly 331. The electrostatic generator 320 is configured to generate static electricity to the reticle assembly 331. The electrostatic generator 320 may be disposed on the box frame 332 of the reticle pod 330. The static electricity alternates between positive electricity and negative electricity. Preferably, the static electricity alternates between positive electricity and negative electricity at a constant frequency ranging from 6 to 600 counts per minute. The reticle assembly 331 includes a reticle 331a and a pellicle 331b covering the reticle 331a. The electrostatic generator 320 generates static electricity to the reticle 331a and the pellicle 331b of the reticle assembly 331. The reticle 331a of the reticle assembly 331 includes a transparent layer 3311 and a metallic layer 3312 disposed on one side of the transparent layer 3311. The pellicle 331b covers the metallic layer 3312 of the reticle 331a. The transparent layer 3311 of the reticle 331a is a quartz layer or a soda-lime glass layer. The metallic layer 3312 of the reticle 331a is a chromium layer having gaps and lines to form a pattern for transferring onto a wafer. The plurality of reticle supports is configured to hold the transparent layer 3311 of the reticle 331a. By periodically alternating the static electricity between positive electricity and negative electricity, charged particles such as ammonium ($NH_4^+$), sulfate ($SO_4^{2-}$) trapped between the space between the reticle 331a and the pellicle 331b tend to accumulate around a center line L of the space between the reticle 331a and the pellicle 331b, as shown in FIGS. 4A to 4C. The charged particles can be kept away from the surface of the reticle 331a and the pellicle 331b to prevent formation of haze particles on the surface of the reticle 331a. Therefore, defects on the wafer caused by haze particles during the exposure process can be greatly reduced.

Referring to FIG. 5, a flowchart of a method of storing a plurality of reticle assemblies according to another implementation of the present disclosure is illustrated. As shown in FIG. 5, the method S500 includes actions S501 to S503. In action S501, a stocker for accommodating a plurality of reticle pods is provided. The stocker and the reticle pods can be referred to the stocker 300 and the reticle pods 330 in FIGS. 3A and 3B. Each of the reticle pods 330 is configured to accommodate one of the reticle assemblies 331. Each of the reticle assemblies includes a reticle 331a and a pellicle 331b covering the reticle 331a. The stocker 300 includes a main frame 310 having an inner space 311, at least one pod support 312 disposed in the inner space 311, and an electrostatic generator 320 couples to each of the reticle assemblies 331. The pod support 312 divides the inner space 311 into a plurality of chambers 313 configured to respectively accommodate the plurality of reticle pods 330. In action S502, the electrostatic generator 320 generates static electricity to the reticle assembly 331. In action S503, the static electricity alternates between positive electricity and negative electricity. Preferably, the static electricity alternates between positive electricity and negative electricity at a frequency ranging from 6 to 600 counts per minute. The reticle 331a of the reticle assembly 331 includes a transparent layer 3311 and a metallic layer 3312 disposed on one side of the transparent layer 3311. The pellicle 331b covers the metallic layer 3312 of the reticle 331a. The electrostatic generator 320 generates static electricity to the reticle 331a and the pellicle 331b of the reticle assembly 331.

Referring to FIG. 6, a flowchart of a method of storing a reticle assembly according to yet another implementation of the present disclosure is illustrated. As shown in FIG. 6, the method S600 includes actions S601 to S603. In action S601, a reticle pod is provided for accommodating the reticle assembly. The reticle pod and the reticle assembly can be referred to the reticle pod 330 and the reticle assembly 331 of FIG. 3B. The reticle pod 330 includes a box frame 332, a plurality of reticle supports 333 disposed in the box frame 332, and an electrostatic generator 320 coupled to the reticle assembly 331. The reticle assembly 331 includes a reticle 331a and a pellicle 331b covering the reticle 331a. In action S602, the electrostatic generator 320 generates static electricity to the reticle assembly 331. In action S603, the static electricity alternates between positive electricity and negative electricity. Preferably, the static electricity alternates between positive electricity and negative electricity at a frequency ranging from 6 to 600 counts per minute. The reticle 331a of the reticle assembly 331 includes a transparent layer 3311 and a metallic layer 3312 disposed on one side of the transparent layer 3311. The pellicle 331b covers the metallic layer of the reticle, and the electrostatic generator generates static electricity to the reticle and the pellicle of the reticle assembly.

As described above, the reticle pod and the stocker of the implementations of the present disclosure include an electrostatic generator for generating static electricity to the reticle and the pellicle of the reticle assembly. The static electricity between positive electricity and negative electricity at a constant frequency to move charged particles trapped in the reticle assembly away from the surface of the reticle and the pellicle. Therefore, the reticle pod and the stocker of the implementations of the present disclosure can prevent haze particles formation on the surface of the reticle, and greatly reduce wafer defects caused by haze contamination.

The implementations shown and described above are only examples. Many details are often found in the art such as the other features of a reticle pod and a reticle stocker. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the implementations described above may be modified within the scope of the claims.

What is claimed is:

1. A stocker for holding a plurality of reticle pods, wherein each of the reticle pods is configured to accommodate a reticle assembly, the reticle assembly comprises a reticle and a pellicle covering the reticle, and the stocker comprising:
    a main frame having an inner space and at least one pod support disposed in the inner space, wherein the pod support divides the inner space into a plurality of chambers configured to respectively accommodate the plurality of reticle pods; and
    an electrostatic generator coupled to the reticle assembly and configured to generate static electricity to the reticle assembly, and the static electricity alternates between positive electricity and negative electricity, so that the reticle and the pellicle carry static charges with the same polarity when the electrostatic generator alternatively generates positive static electricity and negative static electricity.

2. The stocker of claim 1, wherein the static electricity alternates at a constant frequency.

3. The stocker of claim 2, wherein the static electricity alternates at the constant frequency ranging from 6 to 600 counts per minute.

4. The stocker of claim 1, wherein the reticle of the reticle assembly comprises a transparent layer and a metallic layer disposed on one side of the transparent layer, and the pellicle covers the metallic layer of the reticle.

5. The stocker of claim 4, wherein the transparent layer of the reticle is a quartz layer or a soda-lime glass layer.

6. The stocker of claim 4, wherein the metallic layer of the reticle is a chromium layer.

7. The stocker of claim 4, wherein each of the reticle pods comprises:
    a box frame configured to accommodate the reticle assembly; and
    a plurality of reticle supports disposed in the box frame and configured to support the reticle assembly.

8. The stocker of claim 7, wherein the plurality of reticle supports is configured to hold the transparent layer of the reticle.

9. A reticle pod for accommodating a reticle assembly, wherein the reticle assembly comprises a reticle and a pellicle covering the reticle, and the reticle pod comprising:
    a box frame configured to accommodate the reticle assembly;
    a plurality of reticle supports disposed in the box frame and configured to support the reticle assembly; and
    an electrostatic generator coupled to the reticle assembly and configured to generate static electricity to the reticle assembly, and the static electricity alternates between positive electricity and negative electricity, so that the reticle and the pellicle carry static charges with the same polarity when the electrostatic generator alternatively generates positive static electricity and negative static electricity.

10. The reticle pod of claim 9, wherein the static electricity alternates at a frequency ranging from 6 to 600 counts per minute.

11. The reticle pod of claim 9, wherein the reticle of the reticle assembly comprises a transparent layer and a metallic layer disposed on one side of the transparent layer, and the pellicle covers the metallic layer of the reticle.

12. The reticle pod of claim 11, wherein the transparent layer of the reticle is a quartz layer or a soda-lime glass layer.

13. The reticle pod of claim 11, wherein the metallic layer of the reticle is a chromium layer.

14. The reticle pod of claim 11, wherein the plurality of reticle supports is configured to hold the transparent layer of the reticle.

15. A method of storing a plurality of reticle assemblies, wherein each of the reticle assemblies comprises a reticle and a pellicle covering the reticle, and the method comprising actions of:
    providing a stocker for accommodating a plurality of reticle pods, wherein each of the reticle pods is configured to accommodate one of the reticle assemblies, the stocker comprises a main frame having an inner space, at least one pod support disposed in the inner space, and an electrostatic generator coupled to each of the reticle assemblies, and the pod support divides the inner space into a plurality of chambers configured to respectively accommodate the plurality of reticle pods;

generating static electricity to each of the reticle assemblies by the electrostatic generator; and alternating the static electricity between positive electricity and negative electricity, the reticle and the pellicle carrying static charges with the same polarity.

16. The method of claim 15, wherein the static electricity alternates at a frequency ranging from 6 to 600 counts per minute.

17. The method of claim 15, wherein the reticle of the reticle assembly comprises a transparent layer and a metallic layer disposed on one side of the transparent layer, and the pellicle covers the metallic layer of the reticle.

* * * * *